United States Patent [19]
Stack

[11] Patent Number: 6,078,013
[45] Date of Patent: Jun. 20, 2000

[54] CLOVER-LEAF SOLDER MASK OPENING

[75] Inventor: James Richard Stack, Endicott, N.Y.

[73] Assignee: International Business Machines Corporation, Armonk, N.Y.

[21] Appl. No.: 09/168,584

[22] Filed: Oct. 8, 1998

[51] Int. Cl.[7] .................................................. H05K 1/00
[52] U.S. Cl. ..................... 174/262; 174/266; 205/125; 361/767
[58] Field of Search ............... 428/929.1; 430/5; 205/125; 174/250, 261, 262, 263; 29/846, 852, 853; 361/748, 760, 761, 762, 763, 764, 767

[56] References Cited

U.S. PATENT DOCUMENTS

| | | |
|---|---|---|
| 4,065,850 | 1/1978 | Burr et al. . |
| 4,088,545 | 5/1978 | Supnet .................................. 204/15 |
| 4,891,472 | 1/1990 | Veurman et al. . |
| 5,210,940 | 5/1993 | Kawakami et al. . |
| 5,285,057 | 2/1994 | Murohara . |
| 5,295,299 | 3/1994 | Takahashi . |
| 5,344,748 | 9/1994 | Feely . |
| 5,386,087 | 1/1995 | Lee et al. . |
| 5,414,223 | 5/1995 | Suski et al. . |
| 5,453,581 | 9/1995 | Liebman et al. . |
| 5,644,475 | 7/1997 | Woychik et al. . |
| 5,647,123 | 7/1997 | Greenwood et al. . |
| 5,665,525 | 9/1997 | Pienimaa . |

*Primary Examiner*—Sharon Gibson
*Assistant Examiner*—Saleha R. Mohamedulla
*Attorney, Agent, or Firm*—Schmeiser, Olsen & Watts; Lawrence R. Fraley

[57] ABSTRACT

A solder mask having a clover-leaf shaped opening around a PTH for enhanced performance. The solder mask resides on a surface of a printed circuit board comprising lands and PTH's. The opening around the PTH is configured to maintain a minimum channel width between the PTH and an adjacent land while maximizing the opening around the PTH, thereby decreasing the likelihood that the solder mask material will be inadvertently drawn into the PTH.

5 Claims, 3 Drawing Sheets

CLOVER-LEAF SOLDER MASK OPENING

BACKGROUND OF THE INVENTION

1. Technical Field

The present invention relates to printed circuit boards, and more particularly relates to an improved solder mask design for the surface of a printed circuit board.

2. Related Art

Printed circuit boards (PCB's) are often fabricated with a solder mask on the top surface. The solder mask is generally a dielectric material that sits over the surface of the PCB, and includes openings for surface lands and the like. The solder mask provides a protective barrier between surface lands on the surface of the PCB in order to prevent the inadvertent flow of solder between adjacent surface lands during a heating process. The inadvertent flow of solder could occur, for example, when the board is subjected to heat in order to attach components to surface lands. The solder mask prevents solder from running between surface lands causing inadvertent short circuits (i.e., solder bridging). Additionally, by placing the solder mask over a wire, the solder mask prevents unwanted "capillary action" of the solder, i.e., it prevents the solder from running along the wire down into a plated through hole (PTH).

The solder mask is generally comprised of a clear epoxy material such as a photosensitive dielectric that can be placed on the PCB either as sheet of material or as a liquid coating applied with a curtain process. The applied material may then be selectively cured by exposing predetermined areas of the material to radiation to define a final solder mask. A radiation mask is typically used to block portions of the radiation thereby masking those areas of the PCB where openings in the solder mask are desired. After the PCB is selectively exposed to the radiation, a final cleaning step can be used to remove the uncured areas of the solder mask (i.e., where openings will exist).

Because of the close spacing of surface lands and wires on a PCB, the imprecise placement and tolerances of openings in the solder mask on the PCB can cause failures. In order to avoid failures, a minimum amount of coverage of the solder mask must be maintained between closely spaced surface lands. In addition, sufficient clearances must be maintained around PTH's in order to ensure that the solder mask material is not drawn into the PTh. This type of problem is precipitated during the heating process, when portions of the solder mask can be inadvertently drawn into a PTH and attach to the copper plating on the walls of the PTH. When such a dielectric material attaches to the copper plating, reservoirs can be created that attract chemicals from a subsequent processing step thereby causing the PCB to fail.

Referring to FIG. 2, a solder mask design 46, such as that used for a ball grid array is depicted on a surface of a PCB with four surface lands 30, 32, 34 and 36. FIG. 2 also depicts a PTH 40 centered in a PTH land 38, along with a dog bone wire 42 connecting PTH 40 to surface land 36 and forming what is generally referred to as a dog bone structure. Solder mask 46 includes circular openings defined by dotted line regions 44 that surround each of the surface lands 30, 32, 34, 36, and region 45 that overlays PTH land 38. In order to provide maximum utility, a barrier having no less than a minimum width (e.g., 4 mils) as indicated by arrow 50, must be maintained between the region 45 that surrounds PTH 40 and the dotted line region 44 that surrounds adjacent surface land 32 in order to ensure the mechanical and functional integrity of the solder mask 46. At the same time, the largest possible clearance as indicated by arrow 51, must be maintained between the PTH 40 and solder mask region 45 in order to prevent the solder mask material from entering PTH 40. Unfortunately, neither the barrier width 50, nor the clearance 51 can be enlarged without affecting the performance of the other. Because the barrier width 50 must be no less than some predetermined minimum distance, clearance 51 around PTH 40 is often not as large as desired, resulting in a potentially defective PCB.

Therefore, without some way of better ensuring that the dielectric material from the solder mask does not inadvertently get into the PTH's, failures will continue to occur.

SUMMARY OF THE INVENTION

The present invention overcomes the above-mentioned problems in the art by providing a solder mask with a novel opening that can be placed around the perimeter of a PTH. The solder mask opening comprises a non-circular shape that maintains the necessary barrier (e.g., 4 mils) between the PTH and adjacent lands while providing additional clearance around the PTH. The non-circular shape may comprise a clover leaf pattern that includes outwardly extending regions that extend in a direction toward a space in between two adjacent lands.

The invention also comprises a method of forming such a solder mask and comprises the steps of: (1) applying a photosensitive dielectric material over the printed circuit board; and (2) curing a portion of the photosensitive dielectric material to form openings around the perimeter of a plated through hole, wherein the cured portion of the photosensitive dielectric material forms a non-circular pattern around the plated through hole. The non-circular pattern may comprise a clover-leaf pattern that comprises a plurality of outwardly extending regions or humps extending away from the center of the plated through hole, wherein each of the humps is directed at a space between two adjacent lands.

It is therefore an advantage of the present invention to provide a solder mask that will maintain the necessary barrier distances between surface lands and provide additional clearances around a plated through hole to better ensure that the dielectric material used to form the solder mask is not inadvertently drawn into the plated through hole.

The foregoing and other objects, features and advantages of the invention will be apparent in the following and more particular description of the preferred embodiments of the invention as illustrated in the accompanying drawings.

BRIEF DESCRIPTION OF THE DRAWINGS

The preferred exemplary embodiment of the present invention will hereinafter be described in conjunction with the appended drawings, where like designations denote like elements.

DETAILED DESCRIPTION OF THE INVENTION

Figure 1:
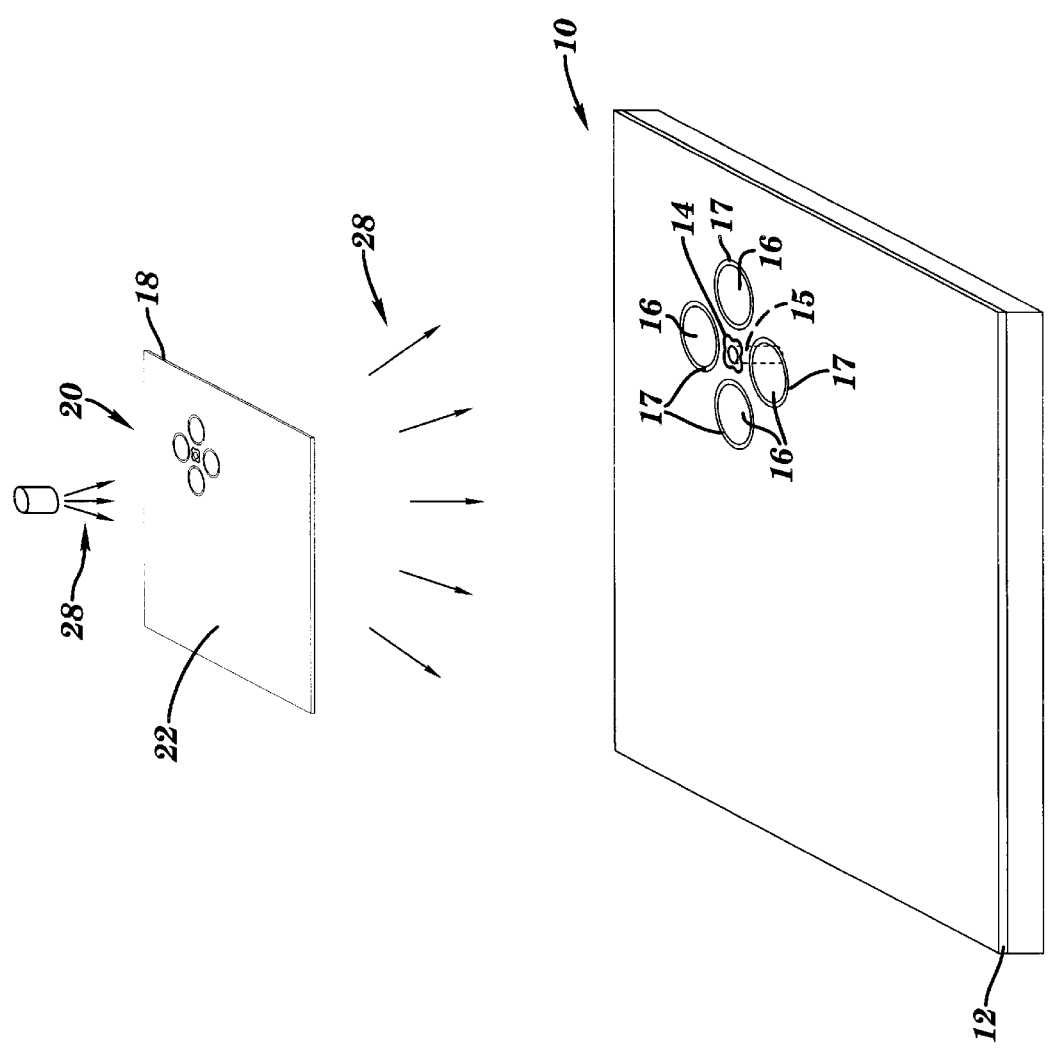
FIG. 1 depicts a printed circuit board with a solder mask being fabricated in accordance with a preferred embodiment of the present invention.

Referring first to FIG. 1, a printed circuit board 10 is depicted with a solder mask 12 being formed in accordance with a preferred embodiment. The solder mask 12 comprises a layer of dielectric material that includes openings 14 and 17 around the surface lands 16 and plated through hole (PH) 15. The opening 14 around PTH 15 is formed in a clover-leaf shape in order to provide the maximum amount of opening possible around the PTH 15 while maintaining the necessary barriers between the PTH 115 and surface lands 16. The solder mask 12 may be formed by applying a photosensitive epoxy material to the surface of the PCB 10, and then selectively exposing the surface of the PCB to radiation 28 with mask 18. Mask 18 includes a transparent portion 22 that allows the radiation to pass and cure the photosensitive epoxy material, and a blocking portion 20 that blocks radiation 28 resulting in uncured portions of the photosensitive epoxy material which will then form openings 14 and 17 in the solder mask 12.

Figure 2:
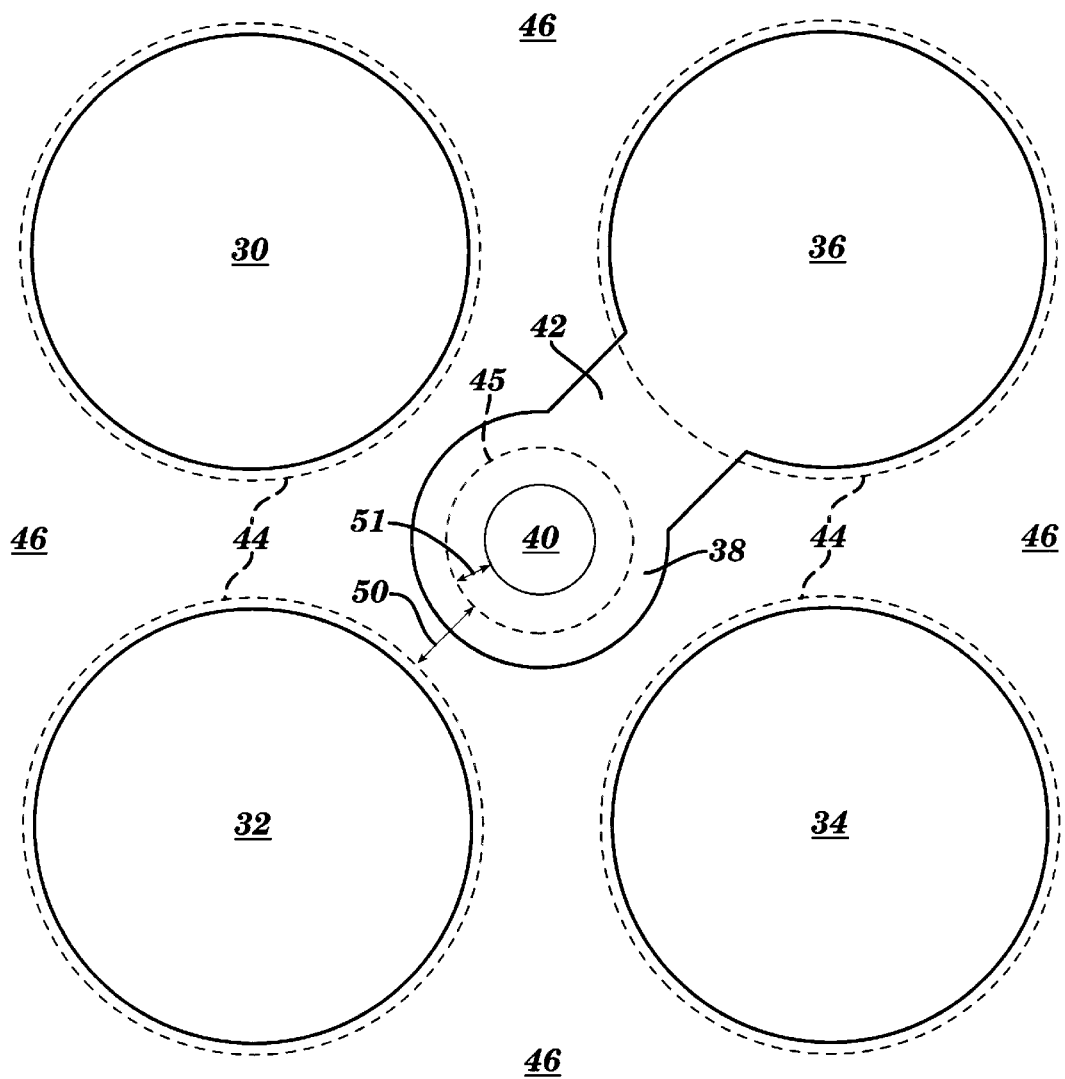
FIG. 2 depicts a surface of a printed circuit board having a related art solder mask with a circular opening around the perimeter of the PTH.
Figure 3:
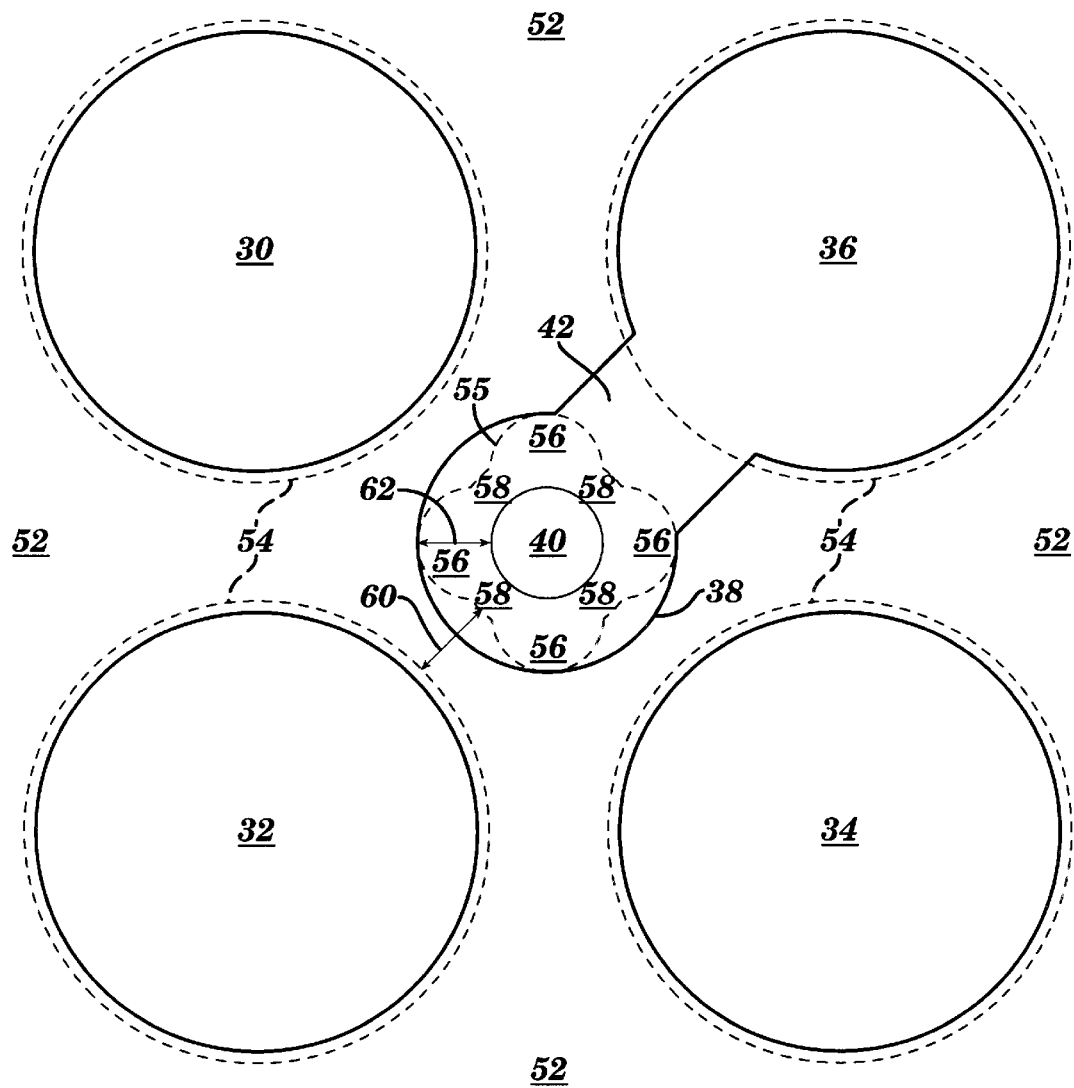
FIG. 3 depicts a surface of a printed circuit board having a solder mask with a non-circular opening formed in accordance with a preferred embodiment of the present invention.

Referring now to FIG. 3, a similar PCB structure as that depicted in FIG. 2 is again shown with circuit lands 30, 32, 34 and 36, PTH 40, PTH land 38, and dog bone wire 42. However, in FIG. 3 an improved solder mask 52, defined by dotted lines 54 and 55 is depicted. The openings 54 around the surface lands 30, 32, 34, 36 typically have a diameter of about 30 mils, with about a 2 mil clearance between the land and the opening. In the embodiment depicted in FIG. 3, it can be seen that the improved solder mask 52 does not include a circular opening around PTH 40, but rather includes a clover-leaf pattern opening 55. The clover-leaf pattern opening includes inwardly extending portions 58 having a generally smaller radius and outwardly extending portions or humps 56 each having a relatively larger radius. In this embodiment, an inwardly extending portion 58 has a radius of about 7.5 mils, while an outwardly extending portion 56 has a radius of about 9–11 mils. Of course, the dimensions of the openings may vary to account for the specific implementation.

The inwardly extending portions 58 of the opening 55 allow the barrier width 60 of the solder mask 52 between the PTH 40 and adjacent surface lands 30, 32, 34, 36 to be large enough (e.g., 4 mils) to meet the particular design requirements. It is recognized that the required size of the barrier width 60 will depend on various factors, including the solder mask material. At the same time, the outwardly extending portions 56 of the opening 55 provide increased clearance 62 by creating a larger opening around much of the PTH 40, thereby decreasing the likelihood that the solder mask material will be inadvertently drawn into PTH 40. In general, the outwardly extending portions 56 of the opening 55 should extend away from the center of the PTH 40 toward a point in between two adjacent lands, or toward an area of the PCB where no closely adjacent opening exists.

Thus, while this preferred embodiment generally depicts a four leaf clover opening, it is recognized that any non-circular solder mask pattern could be utilized that (1) maintains the necessary barrier width between the PTH and an adjacent land, and (2) provides additional clearance around the PTH. For example, a spiked or star pattern could potentially be implemented as well as outwardly extending portions that include contoured extensions. Moreover, the general shape and configuration of this opening can be customized to be dependent upon the general configuration of the PCB. Thus, patterns with fewer or greater than four outwardly extending portions can be used. Finally, it should be recognized that the noncircular openings need not be exclusively applied to PTH's, but can be applied around any surface feature on a PCB where similar requirements exist.

The foregoing description of the preferred embodiments of the invention have been presented for the purposes of illustration and description. They are not intended to be exhaustive or to limit the invention to the precise form disclosed, and obviously anally many modifications and variations are possible in light of the above teachings. Such modifications and variations that may be apparent to a person skilled in the art are intended to be included with the scope of this invention as defined by the accompanying claims.

What is claimed is:

1. A printed circuit board having a plated through hole, proximate at least one surface land, and a solder mask, wherein the solder mask includes an opening around the plated through hole, and wherein the solder mask opening comprises a non-circular shape said opening further comprising at least one outwardly extending region that provides additional clearance of the solder mask around the plated through hole, and wherein the opening comprises an inwardly extending region across from an adjacent surface land, the inwardly extending region oriented to maintain a barrier of solder mask between the plated through hole and the adjacent surface land.

2. The printed circuit board of claim 1, wherein the outwardly extending region extends into areas between two adjacent surface lands.

3. The printed circuit board of claim 1, wherein the outwardly extending region extends toward a region of the solder mask that does not include an immediately adjacent opening.

4. The printed circuit board of claim 1, wherein the opening comprises a clover-leaf shape.

5. A printed circuit board having a plated through hole, at least one surface land and a solder mask, wherein the solder mask includes an opening around the plated through hole, and wherein the opening comprises a non-circular shape, said shape including at least one inwardly extending region the inwardly extending region having a depth proportional to a barrier width between the plated through hole and an adjacent surface land, and wherein said inwardly extending region is oriented proximate the surface land.

* * * * *